(12) United States Patent
Kim

(10) Patent No.: US 6,962,840 B2
(45) Date of Patent: Nov. 8, 2005

(54) METHOD OF FORMING MOS TRANSISTOR

(75) Inventor: Myoung-soo Kim, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/659,954

(22) Filed: Sep. 11, 2003

(65) Prior Publication Data

US 2004/0048435 A1 Mar. 11, 2004

Related U.S. Application Data

(63) Continuation-in-part of application No. 10/455,600, filed on Jun. 5, 2003.

(30) Foreign Application Priority Data

Sep. 11, 2002 (KR) .......................................... 2002-54905
Jul. 29, 2003 (KR) ................................ 10-2003-0052366

(51) Int. Cl.⁷ ............................................ H01L 21/336
(52) U.S. Cl. ....................... 438/197; 438/239; 438/250; 257/300
(58) Field of Search .......................................... 438/197

(56) References Cited

U.S. PATENT DOCUMENTS

| 5,138,412 A | * | 8/1992 | Hieda et al. ................. 257/296 |
| 5,918,119 A | | 6/1999 | Huang ......................... 438/238 |
| 6,475,862 B1 | * | 11/2002 | Ando .......................... 438/264 |
| 2004/0004246 A1 | * | 1/2004 | Anezaki ....................... 257/315 |

FOREIGN PATENT DOCUMENTS

| JP | 07-211861 | 8/1995 | ........... H01L/27/04 |
| JP | 2002-009168 | 1/2002 | ....... H01L/21/8234 |
| KR | 1999-0042744 | 6/1999 | ......... H01L/21/334 |
| KR | 102000-0027814 A | 5/2000 | ......... H01L/21/336 |

OTHER PUBLICATIONS

Korean Patent Abstracts for Publication No. 1999–0042744.
Japan Patent Abstracts for Publication No. 2002–009168.
Japan Patent Abstracts for Publication No. 07–211861.
Korean Patent Abstracts for Publication No. 102000–0027814A.

* cited by examiner

*Primary Examiner*—Thao P. Le
(74) *Attorney, Agent, or Firm*—F. Chau & Associates LLC

(57) ABSTRACT

Methods of simultaneously forming MOS transistors and a capacitor on a substrate having gate insulation layers of varying thicknesses are disclosed. A method includes forming field regions in a substrate to define a first transistor region, a capacitor region, and a second transistor region, forming a first gate stack in the first transistor region and a lower electrode in the capacitor region, and forming an upper electrode on the lower electrode with a dielectric layer interposed therebetween and a second gate stack in the second transistor region.

11 Claims, 22 Drawing Sheets

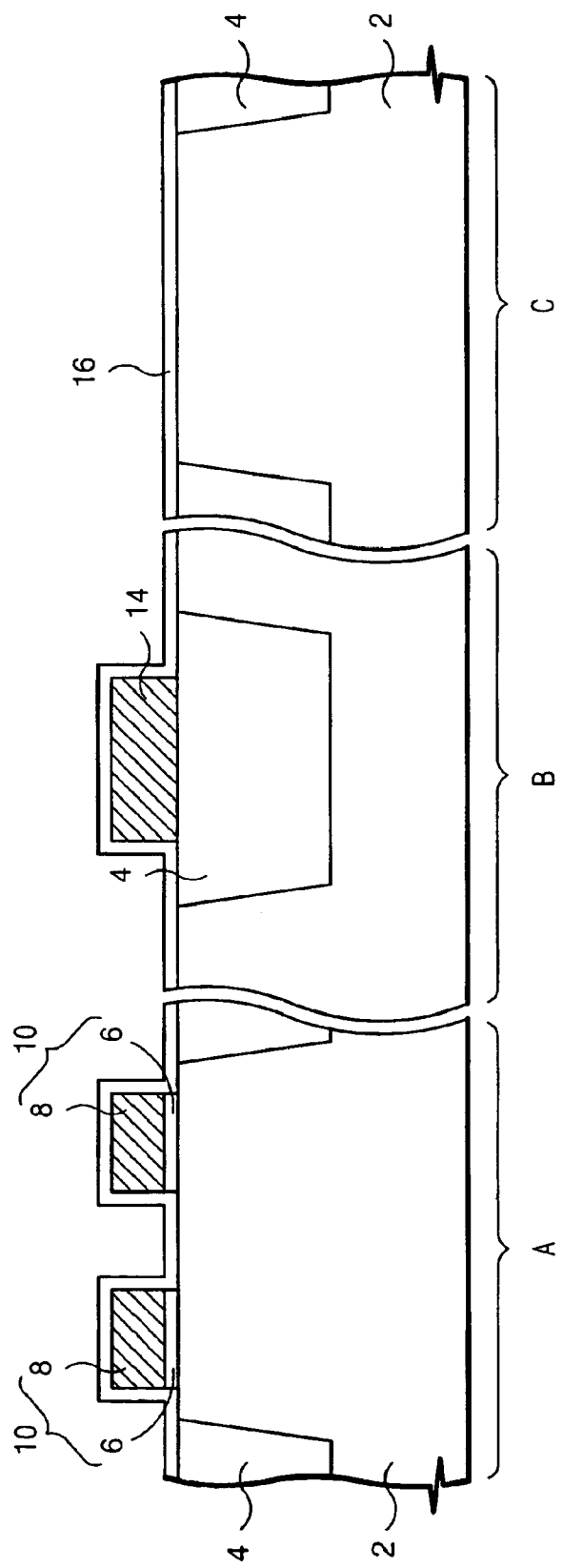

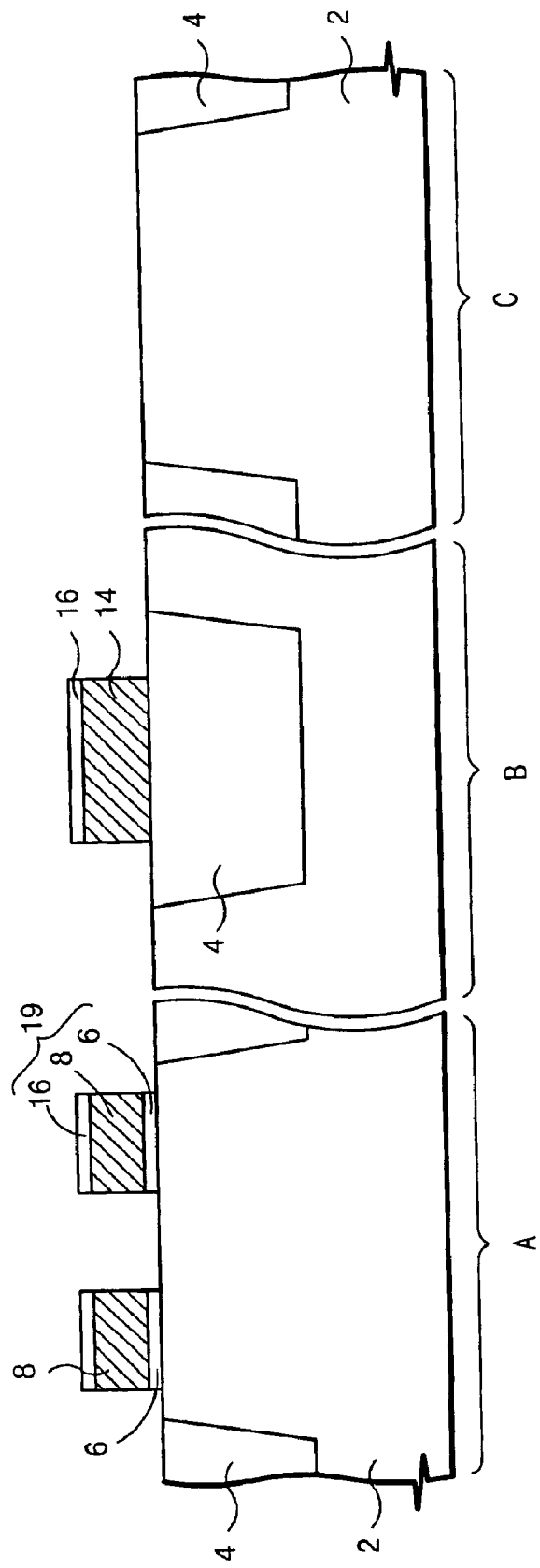

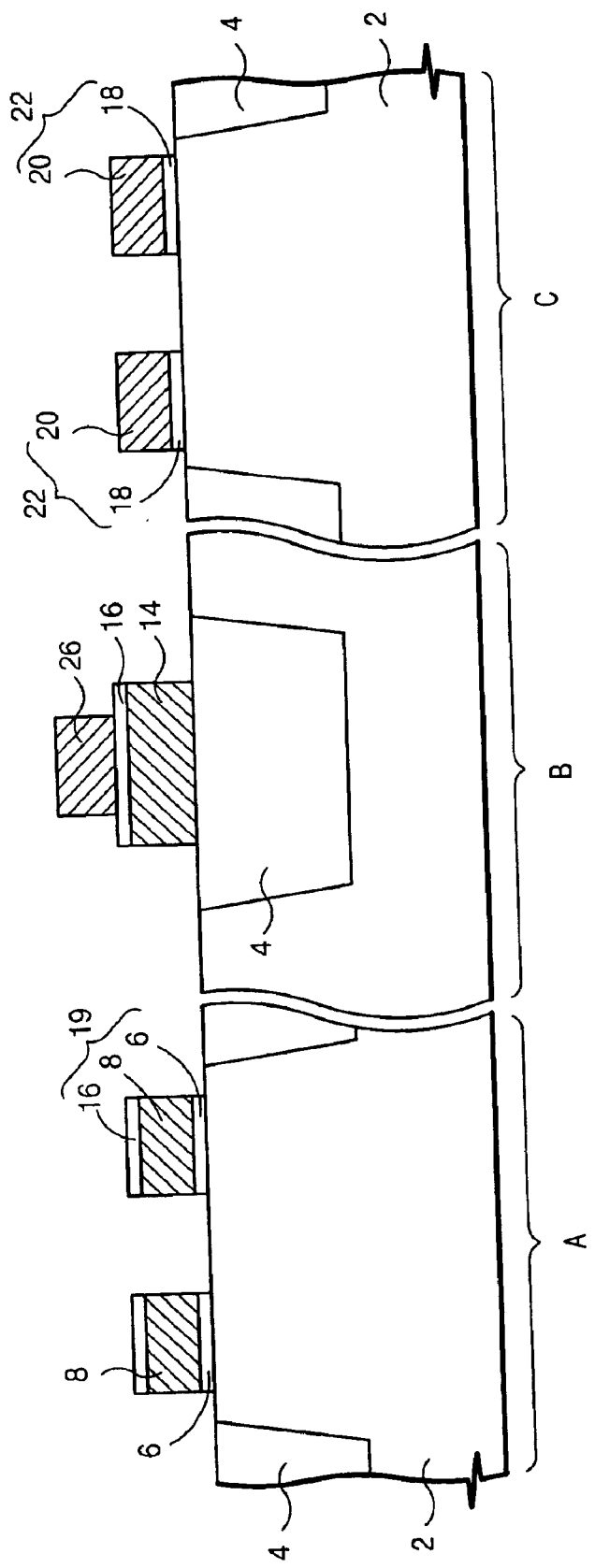

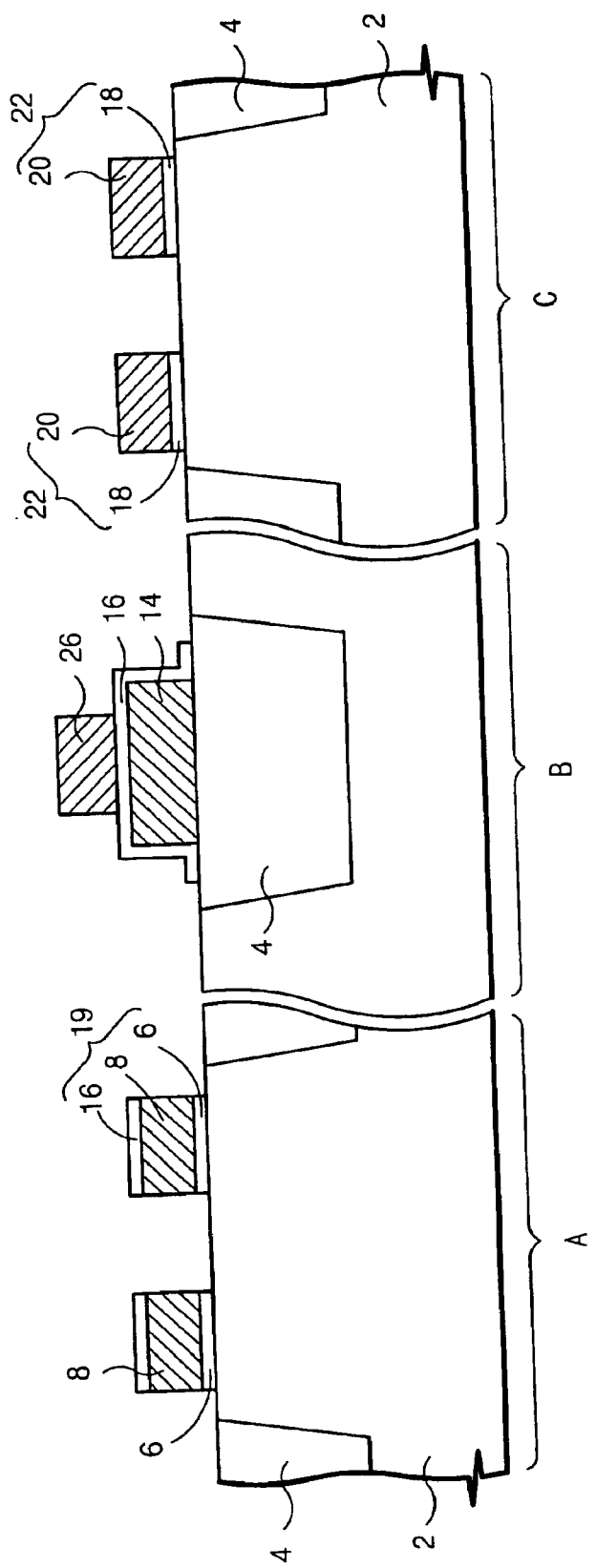

METHOD OF FORMING MOS TRANSISTOR

This is a continuation-in-part of application Ser. No.: 10/455,600, entitled "METHOD OF FORMING MOS TRANSISTOR" filed Jun. 5, 2003. The disclosure of which in its entirety is incorporated by reference herein.

BACKGROUND OF THE INVENTION

1. Field of the Invention

The present invention relates generally to methods of forming MOS transistors, and more particularly to methods of simultaneously forming MOS transistors and a capacitor, an electrically erasable and programmable read only memory or a resistance on a substrate having gate insulation layers of varying thicknesses.

2. Discussion of Related Art

In a semiconductor integrated circuit (IC), electrical devices such as a transistor, a capacitor and a resistor are integrated into a chip. Therefore, methods for effectively integrating these electrical devices into a chip have been developed. For example, a method of simultaneously forming a plate electrode of a poly-insulation-poly (PIP) capacitor and a gate electrode of a MOS transistor is taught in U.S. Pat. No. 6,303,455, entitled "Method of fabricating capacitor".

There have been extensive studies on simultaneously employing logic technologies for processing data (e.g., CPU technologies) and memory technologies for storing data. In addition, transistor technologies have been adapted to the logic and memory technologies. The current supplying ability of a transistor, and its low leakage current and high breakdown voltage characteristics are important in the memory technology. Therefore, a novel method to effectively embody MOS transistors having insulation layers of varying thicknesses in a single chip is needed.

SUMMARY OF THE INVENTION

An embodiment of the present invention provides a method of forming MOS transistors having insulation layers of varying thicknesses from each other.

According to another embodiment of the present invention, a method of forming a semiconductor device includes forming field regions in a substrate to define a first transistor region, a capacitor region, and a second transistor region. Simultaneously, a first gate stack is formed in the first transistor region and a lower electrode is formed in the capacitor region. Then, an upper electrode is formed on the lower electrode with a dielectric layer interposed therebetween and a second gate stack is simultaneously formed in the second transistor region.

According to another embodiment of the present invention, a method of fabricating a semiconductor device comprises forming field regions in a substrate to define a first transistor region, a capacitor region and a second transistor region. Simultaneously, a gate pattern is formed in the first transistor region and a lower electrode is formed in the capacitor region. Next, an upper electrode is formed on the lower electrode with a dielectric layer interposed therebetween and a second gate stack is simultaneously formed in the second transistor region. Then, the gate pattern is patterned to form a first gate stack, wherein forming the upper electrode with dielectric layer interposed thereunder and the second gate stack comprises forming a dielectric layer on the lower electrode, forming a second insulation layer and a second conductive layer, and patterning the second conductive layer and the second insulation layer to form the upper electrode and the second gate stack.

According to another embodiment of the present invention, a method of forming a semiconductor substrate comprises: forming isolation layers in predetermined regions of a semiconductor substrate to define a first region, a second region and a third region; forming a first gate insulating layer and a first gate conductive pattern stacked sequentially on the first region, a second gate insulating layer and a second gate conductive pattern stacked sequentially on the second region, and a third gate insulating layer and the second gate conductive pattern stacked sequentially on the third region; and patterning together the first gate conductive pattern and the second gate conductive pattern to form a first gate electrode, a second gate electrode and a third gate electrode in the first, second and third regions, respectively. Further, the first gate insulating layer, the second gate insulating layer and the third insulating layer have varying thicknesses and each layer has a different thickness as compared to the other layers.

Preferably, the step of forming isolation layers comprises forming the first gate insulating layer and the first gate conductive pattern stacked sequentially on the first region, forming the second gate insulating layer and the third insulating layer on the second region and the third region, respectively, wherein the thickness of the second gate insulating layer differs from the thickness of the third insulating layer. Next, a second gate conductive layer is formed on the entire surface of the semiconductor substrate having the second and third gate insulating layers and the second gate conductive layer is patterned to form the second gate conductive pattern exposing the first gate conductive pattern in the first region.

BRIEF DESCRIPTION OF THE DRAWINGS

FIGS. 1A–1D are cross-sectional views showing steps of forming MOS transistors and a capacitor in accordance with a first exemplary embodiment of the present invention.

FIGS. 2A–2B are cross-sectional views showing steps of forming MOS transistors and a capacitor in accordance with a second exemplary embodiment of the present invention.

FIGS. 3A–3E are cross-sectional views showing steps of forming MOS transistors and a capacitor in accordance with a third exemplary embodiment of the present invention.

DETAILED DESCRIPTION OF PREFERRED EMBODIMENTS

The present invention will now be described more fully hereinafter with reference to the accompanying drawings, in which exemplary embodiments of the invention are shown.

A first transistor is formed in a region "A" and a capacitor is formed in a region "B." A second transistor is formed in a region "C." In any of exemplary embodiments discussed in relation to FIGS. 1A–4C, the capacitor is formed in the region "B," but an electrically erasable and programmable read only memory (EEPROM) or a resistor may be formed in region "B" as well. For example, a lower electrode of the capacitor corresponds to a floating gate of the EEPROM and a dielectric layer to inter-gate dielectric, an upper electrode of the capacitor to a control gate of the EEPROM. In addition, regions "A," "B" and "C" of the drawings, referring to FIGS. 1A–4C, include two transistors, one capacitor and two transistors. This is for the convenience of explanation.

FIGS. 1A–1D are cross-sectional views showing steps of forming MOS transistors in accordance with a first exemplary embodiment of the present invention.

Figure 1A:
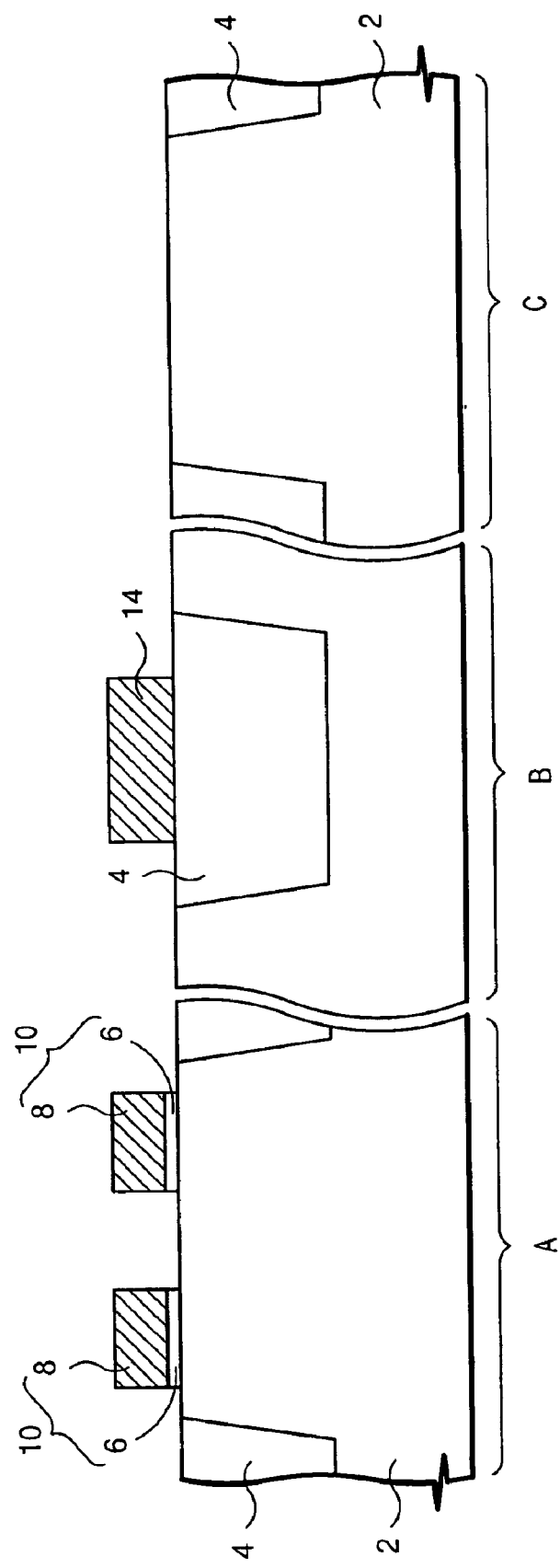

Referring to FIG. 1A, field regions 4 are formed to define at least one active region in a substrate 2. In FIG. 1A, a predetermined region of the substrate 2 is selectively etched to form trenches. Then, the trenches are filled with an insulation material and polished using a chemical mechanical polishing to form the field regions 4. A first insulation layer and a first conductive layer are formed on a substrate including the field regions 4. A photolithographic process is performed to form a first gate stack 10 comprising a first gate insulation layer 6 and a first gate electrode 8 in region "A." Simultaneously, a lower electrode 14 of a capacitor is formed in region "B." The first gate insulation layer 6 is preferably formed of silicon oxide and the first conductive layer is preferably formed of polysilicon or any like material.

Referring to FIG. 1B, a dielectric layer 16 is formed on an entire surface of a substrate 2 including the first gate stack 10 and the lower electrode 14. The dielectric layer 16 is a material selected from the group consisting of silicon oxide, silicon nitride, oxide-nitride-oxide (ONO), tantalum oxide, barium-strontium-titanium (Ba—Sr—Ti) oxide, zirconium (Zr) oxide, hafnium (Hf) oxide, plumbum-zinc-titanium (Pb—Zn—Ti) oxide, strontium-bismuth-tantalum (Sr—Bi—Ta) oxide, and any combination thereof.

Figure 1C:
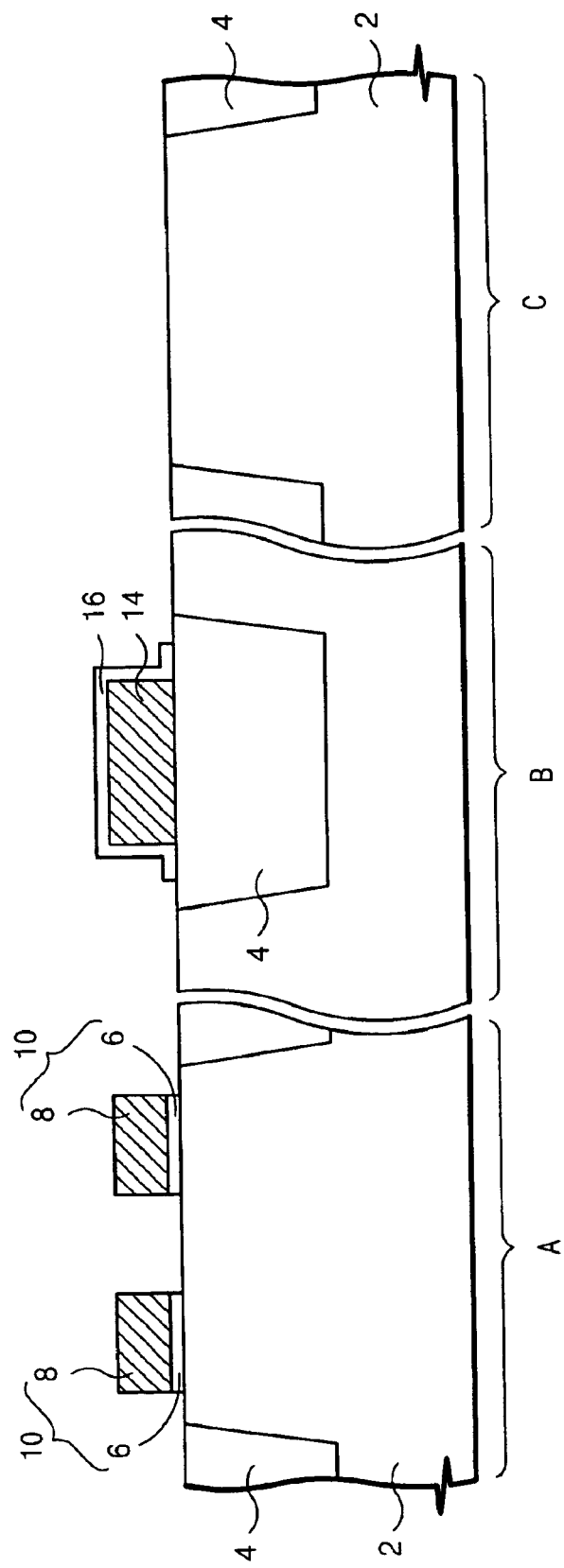

Referring to FIG. 1C, the dielectric layer 16 is patterned such that the dielectric layer 16 remains on the lower electrode 14 in region "B."

Figure 1D:
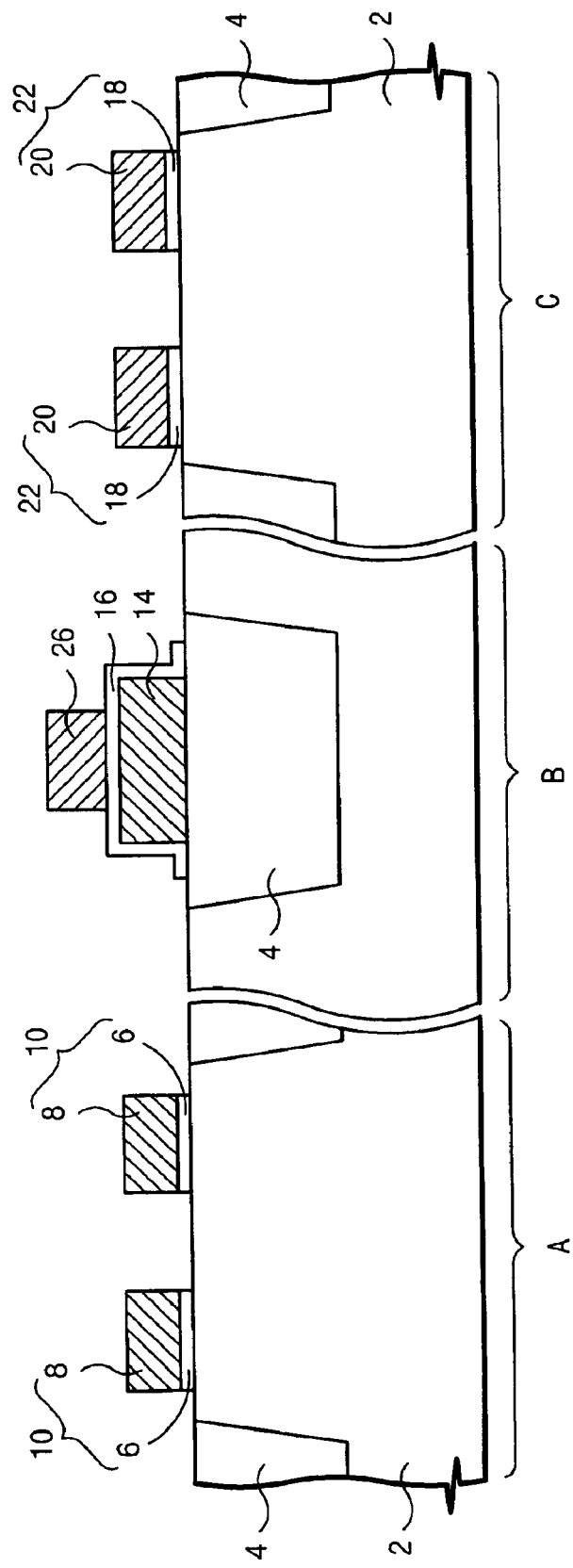

Referring to FIG. 1D, a second insulation layer and a second conductive layer are sequentially stacked on an entire surface of the substrate 2. The second conductive layer and the second insulation layer are patterned by a photolithographic process to form a second gate stack 22 in region "C" and an upper electrode 26 of the capacitor in region "B." The second gate stack 22 comprises a second gate insulation layer 18 and a second gate electrode 20. The second insulation layer 18 is formed having a different thickness than the first insulation layer 6, so that transistors in regions "A" and "C" may have different characteristics. In other words, a MOS transistor formed in region "C" can have different characteristics than a MOS transistor formed in region "A" and a capacitor formed in region "B."

Source and drain regions are formed in the substrate on opposite sides of the gate stacks 10 and 22, respectively, to complete the formation of a MOS transistor (not shown).

FIGS. 2A and 2B are cross-sectional views showing steps of forming MOS transistors and a capacitor in accordance with a second exemplary embodiment of the present invention.

Referring to FIG. 2A, field regions 4 are formed to define at least one active region in a substrate 2. A first insulation layer, a first conductive layer, and a dielectric layer are sequentially stacked on an entire surface of the substrate 2. The dielectric layer, the first conductive layer, and the first gate insulation layer are patterned by a photolithographic process to form a gate stack 19 in region "A." Simultaneously, a lower electrode 14 and a dielectric layer 16 of a capacitor are formed in region "B." The gate stack 19 comprises a first gate insulation layer 16, a first gate electrode 8, and a dielectric layer 16.

Referring to FIG. 2B, a second insulation layer and a second conductive layer are formed on an entire surface of the substrate. Then, the second insulating layer and the second conductive layer are patterned by a photolithographic process to form a second gate stack 22 in region "C" and an upper electrode 26 in region "B." The second gate stack 22 comprises a second gate insulation layer 18 and a second gate electrode 20. The second insulation layer 18 is formed having a different thickness than the first gate insulation layer 6. In other words, transistors in region "A" and region "C" may have different characteristics from each other.

Source and drain regions are formed in a substrate on opposite sides of the gate stacks 19 and 22, respectively, thereby completing the formation of the MOS transistors.

In the second exemplary embodiment, the gate stack 19, the lower electrode 14, and the dielectric layer 16 are patterned at the same time, thereby reducing the number photolithographic steps for forming a semiconductor device.

FIGS. 3A–3E are cross-sectional views showing steps of forming MOS transistors and a capacitor in accordance with a third exemplary embodiment.

Figure 3A:
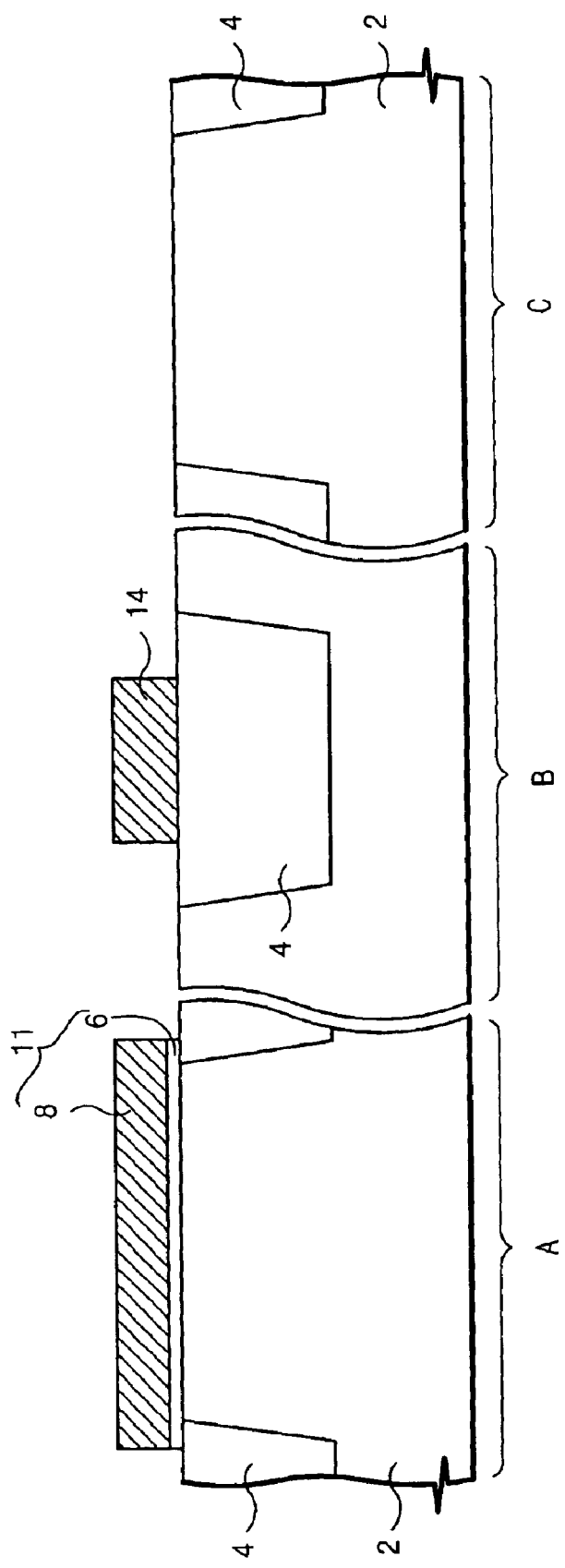

Referring to FIG. 3A, field regions 4 are formed to define at least one active region in a substrate 2. A first insulation layer and a first conductive layer are sequentially formed on the substrate 2. The first conductive layer and the first insulation layer are patterned by a photolithographic process so as to form a gate pattern 11 in a region "A" and a lower electrode 14 in a region "B." The gate pattern 11 comprises a first gate insulation layer 6 and a first gate conductive pattern 8. Preferably, edges of the gate pattern 11 overlap the field regions 4.

Figure 3B:
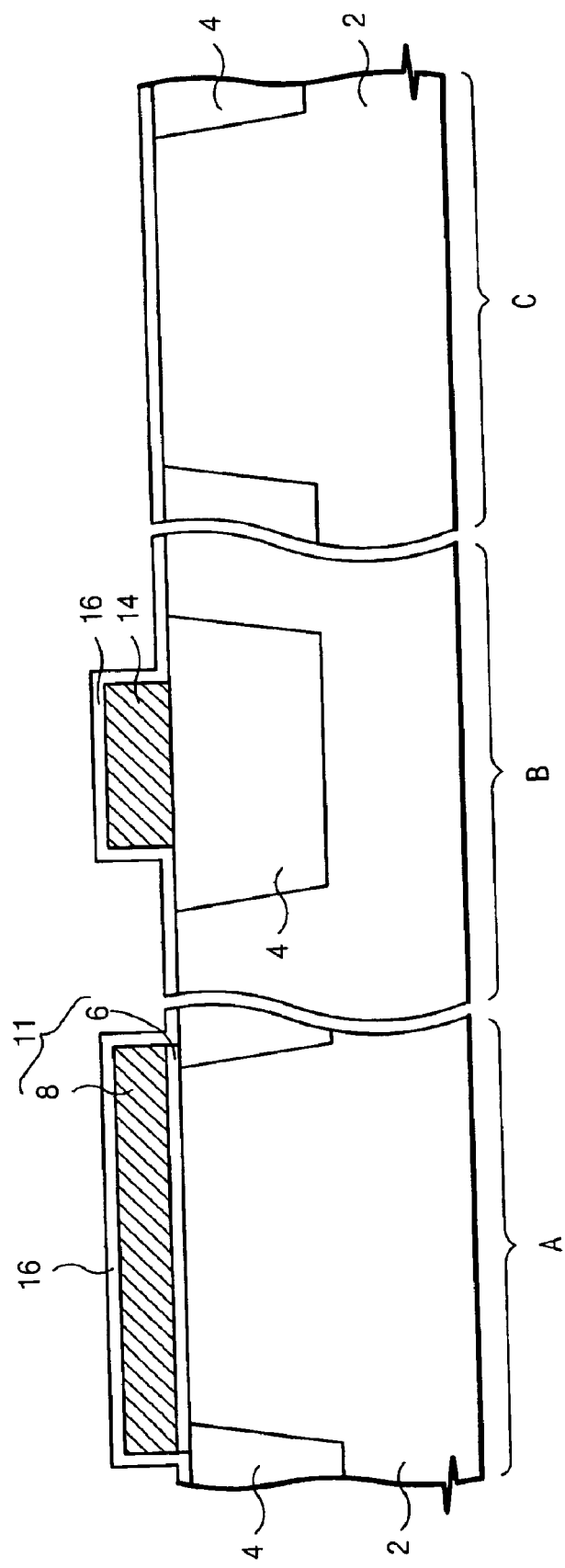

Referring to FIG. 3B, a dielectric layer 16 is formed on a substrate which includes the gate pattern 11 and the lower electrode 14.

Figure 3C:
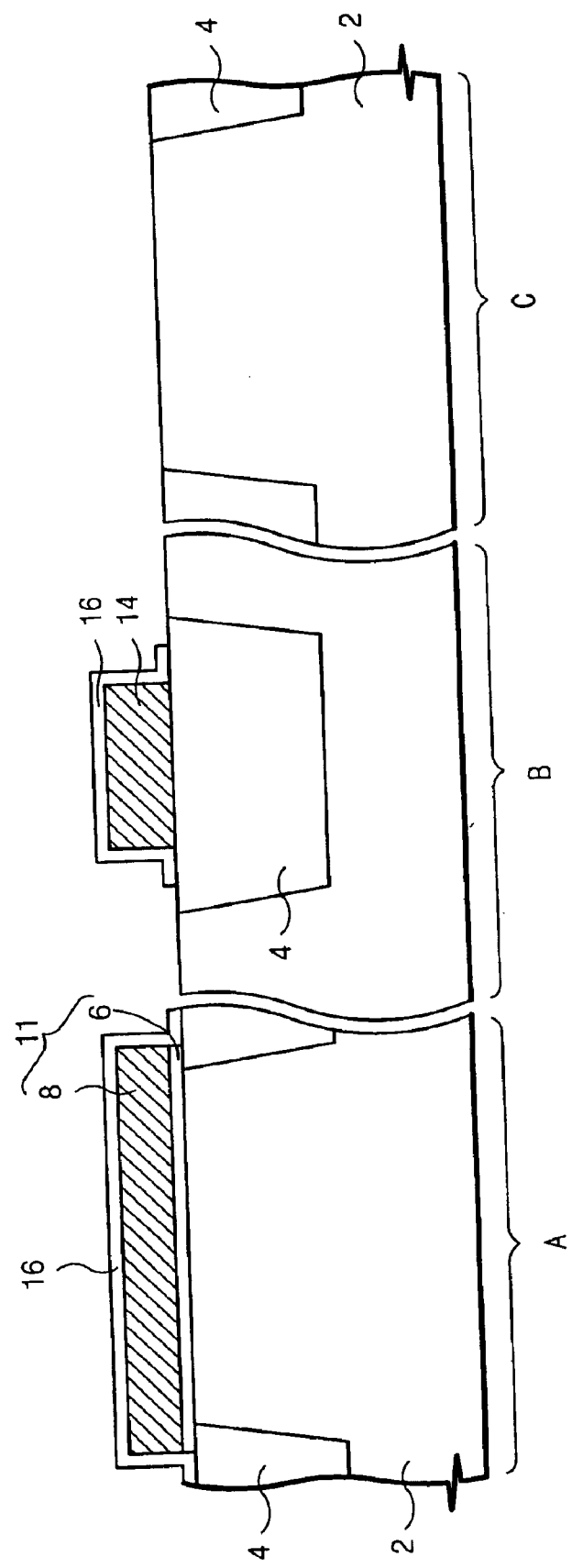

Referring to FIG. 3C, the dielectric layer 16 is patterned by a photolithographic process such that the dielectric layer 16 remains on an entire surface of the gate pattern 11 in region "A" and the lower electrode 14 in region "B."

Figure 3D:
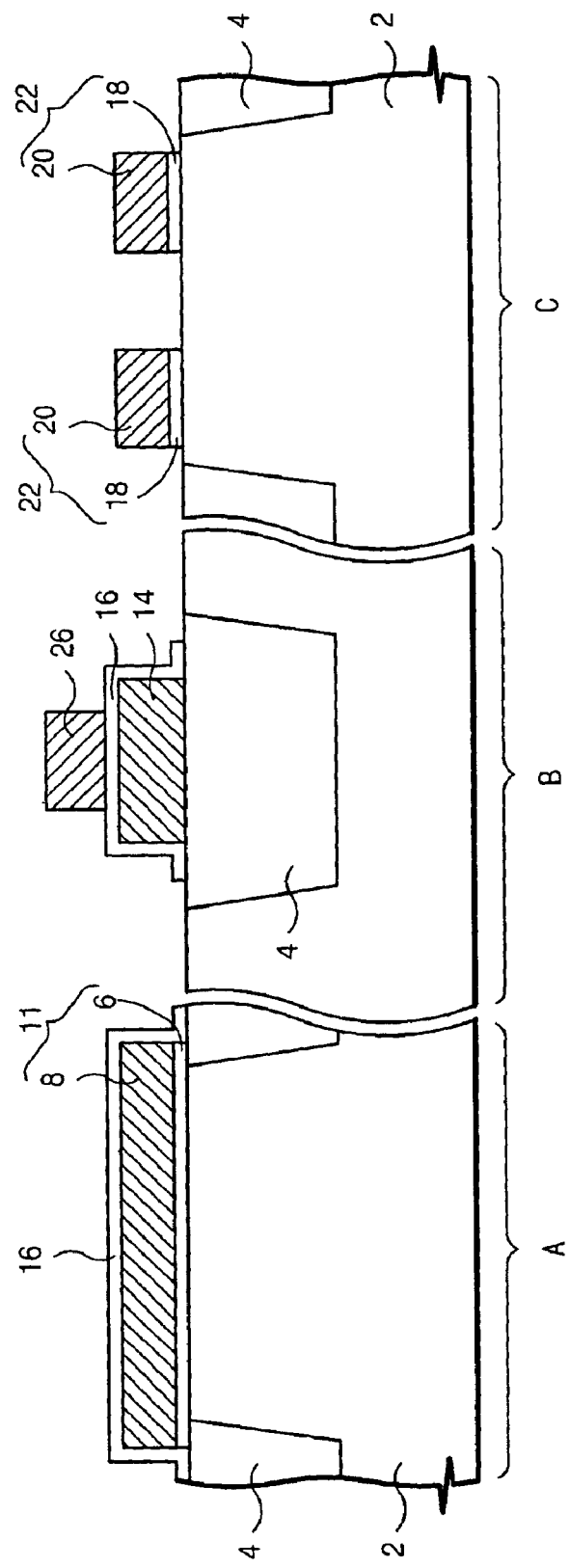

Referring to FIG. 3D, a second insulation layer and a second conductive layer are sequentially stacked on an entire surface of the substrate. The second conductive layer and the second insulation layer are patterned by a photolithographic process to form a second gate stack 22 in a region "C" and an upper electrode 26 in region "B." The second gate stack 22 comprises a second gate insulation layer 18 and a second gate electrode 20. The second gate insulation layer 18 is formed having a different thickness than the first gate insulation layer 6.

Referring to FIG. 3E, the gate pattern 11 is patterned by a photolithographic process to form a first gate stack 19 in a region "A."

Source and drain regions are formed in a substrate on opposite sides of the gate stacks 19 and 22, respectively, to complete the formation of a MOS transistor.

In the third embodiment, the dielectric layer 16 covers a top portion of the first gate stack 19 and serves as a barrier layer during a subsequent ion implantation process. For example, while boron (B) ions are implanted to form a source and a drain of a PMOS, boron penetration is prevented by the dielectric layer 16.

Figure 4A:
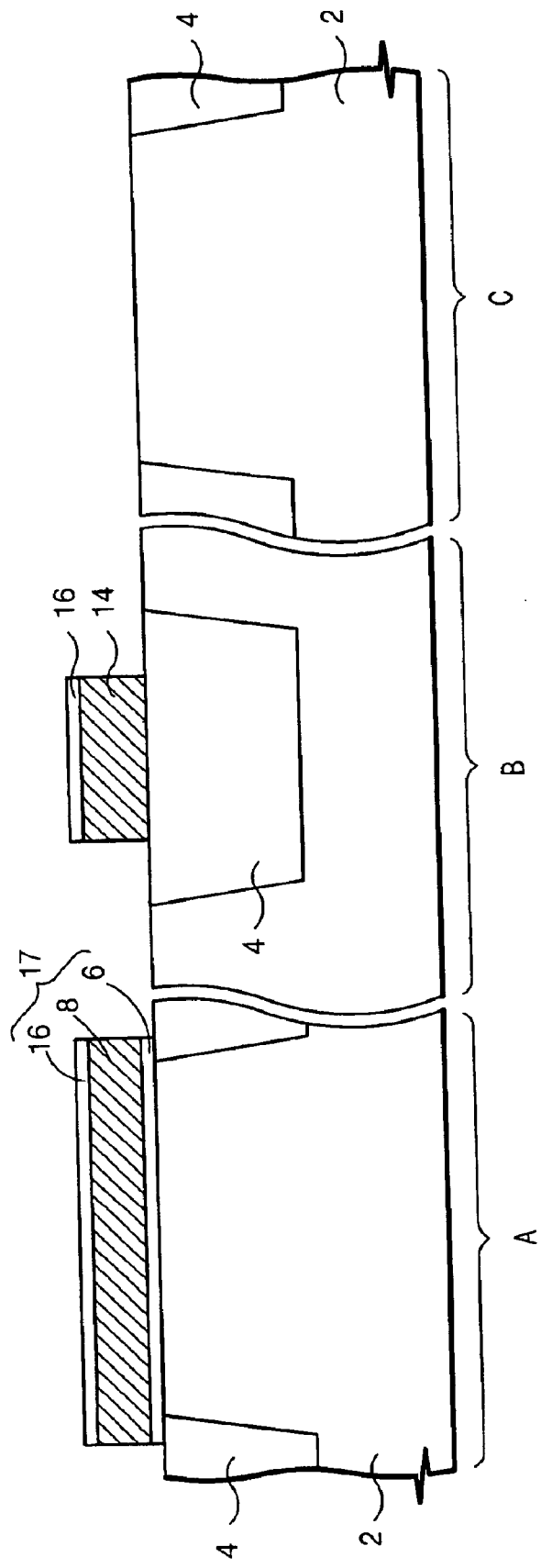
FIGS. 4A–4C are cross-sectional views showing steps of forming MOS transistors and a capacitor in accordance with a fourth exemplary embodiment of the present invention.
Figure 4B:
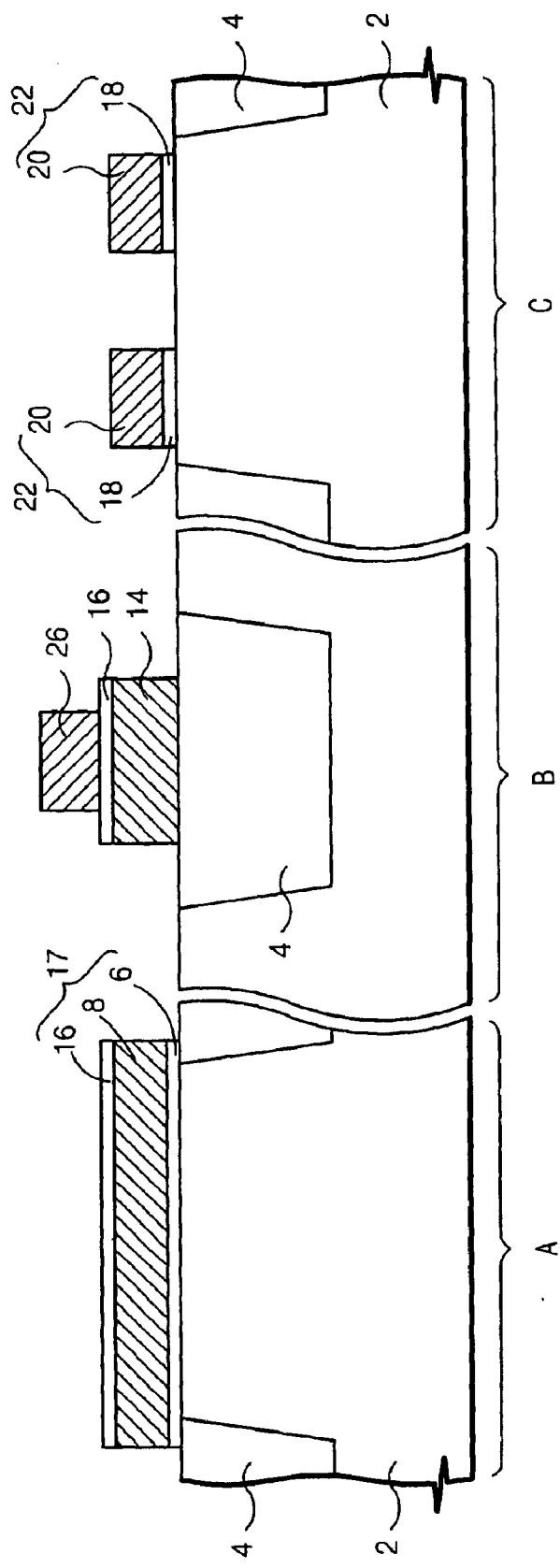
Figure 4C:
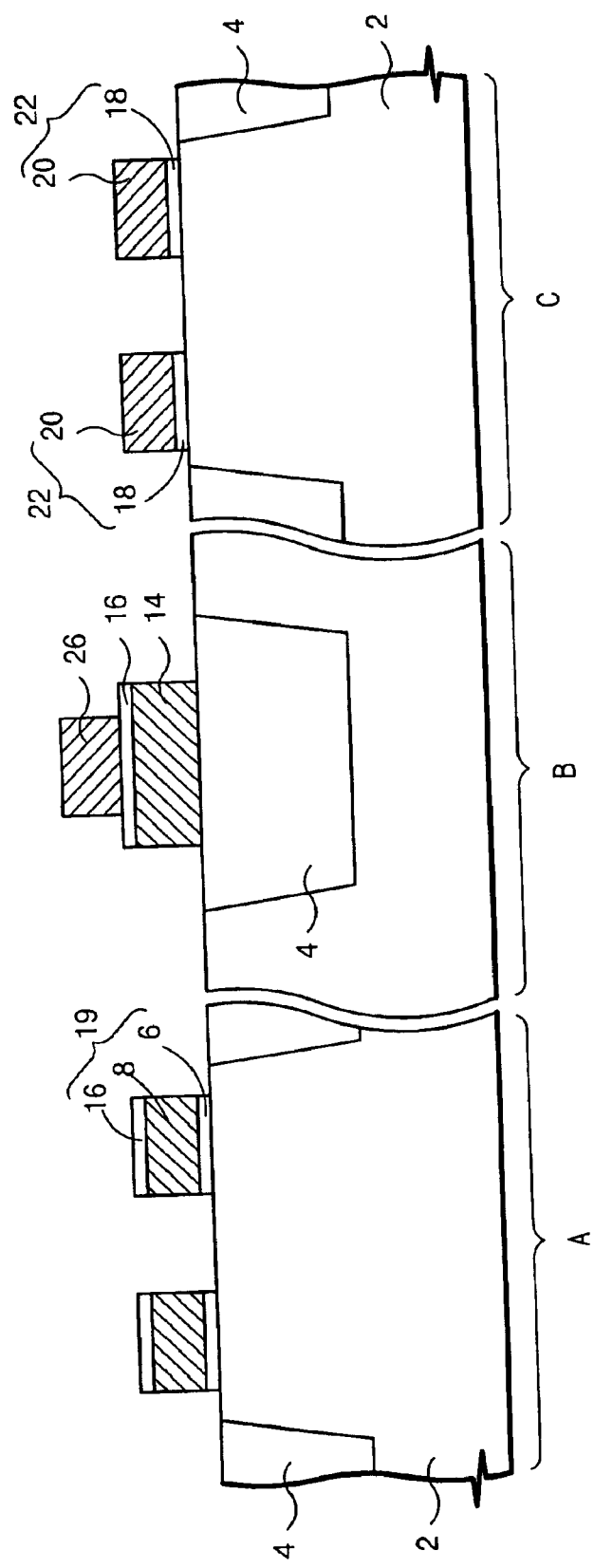

FIGS. 4A–4C are cross-sectional views showing steps of forming MOS transistors and a capacitor in accordance with a fourth exemplary embodiment of the present invention.

Referring to FIG. 4A, field regions 4 defining at least one active region are formed in a substrate 2. Then, a first insulation layer, a first conductive layer, and a dielectric layer are sequentially stacked on an entire surface of a substrate 2. The dielectric layer, the first conductive layer, and the first insulation layer are patterned by a photolithographic process to form a first gate pattern 17 in a region "A" and a lower electrode 14 and a dielectric layer 16 in a region "B." The first gate pattern 17 comprises a first gate insulation layer 6, a first gate electrode 8 and a dielectric layer 16.

Referring to FIG. 4B, a second insulation layer and a second conductive layer are formed on an entire surface of the substrate. Then, the second conductive layer and the second insulation layer are patterned using a photolithographic process to form a second gate stack 22 in a region "C" and an upper electrode 26 in region "B." The second gate stack 22 comprises a second gate insulation layer 18 and a second gate electrode 20. The second insulation layer 18 is formed having a different thickness than the first insulation layer 6.

Referring to FIG. 4C, the gate pattern 17 is patterned by a photolithographic process to form a first gate stack 19.

Source and drain regions (not shown) are formed in a substrate on opposite sides of the first and second gate stacks 19 and 22, respectively, to complete the formation of a MOS transistor.

In the fourth embodiment, the gate pattern 17, the lower electrode 14, and the dielectric layer 16 are simultaneously patterned, thereby reducing the number of photolithographic processes for forming semiconductor devices.

FIGS. 5A to 5E are cross-sectional views illustrating a method of fabricating a semiconductor device in accordance with a fifth embodiment of the present invention.

Figure 5A:
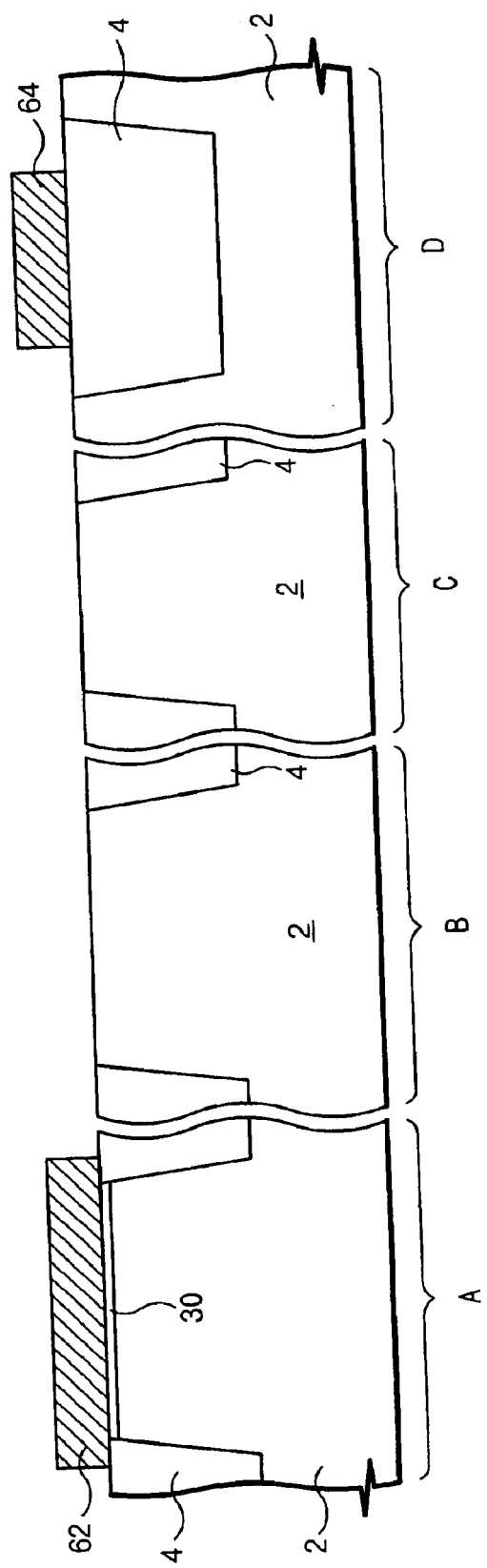
FIGS. 5A–5E are cross-sectional views showing steps of forming MOS transistors and a capacitor in accordance with a fifth exemplary embodiment of the present invention.

Referring to FIG. 5A, isolation layers 4 are formed in a predetermined region of a semiconductor substrate 2 to divide the semiconductor substrate 2 into a plurality of regions. The regions may comprise a first region "A", second region "B" and third region "C". In addition, the first region "A," second region "B" and third region "C" may be classified by the operation voltages of transistors formed in their respective regions. According to this embodiment of the present invention, the first region "A", second region "B" and third region "C" are active regions, which include transistors having operation voltages of 5.5V, 2.5V and 30V, respectively. Further, a part of the isolation layers 4 may be used to define a capacitor region "D" including a capacitor, as shown in FIG. 5A.

After forming the isolation layers 4, a first gate insulating layer 30 is formed on the first region "A." The first gate insulating layer 30 may be a silicon dioxide layer, which is preferably grown to a thickness of between about 50 Å to about 300 Å by thermal oxidation. If the thermal oxidation process is applied to form the first gate insulating layer 30, the first gate insulating layer 30 may be formed on the entire surface of the semiconductor substrate 2. In this case, the first gate insulating layer 30 should be removed from the second region "B" and the third region "C," and the removal of the first gate insulating layer 30 from the second region "B" and third region "C" can be accomplished by an additional process.

Next, a first gate conductive layer is formed on the semiconductor substrate 2 having the first gate insulating layer 30. According to another embodiment of the present invention, the first gate conductive layer may be a polycrystalline silicon layer having a thickness of between about 1000 Å to about 2000 Å. Alternatively, other conductive materials can be used for the first gate conductive layer. If the first gate conductive layer is formed of polycrystalline silicon, various doping methods such as in-situ doping, subsequent impurity diffusion and the like may be applied for doping the first gate conductive layer. Further, a desired impurity concentration and desired conductivity of the first gate conductive layer can be obtained by controlling the doping process.

Next, the first gate conductive layer is patterned to form a first gate conductive pattern 62 in the first region "A" and a lower electrode 64 for a capacitor in the capacitor region "D." The patterning process of the first gate conductive layer may be utilized for the abovementioned removal of the first gate insulating layer 30 in the second region "B" and third region "C."

The first gate conductive pattern covers the entire surface of the first gate insulating layer 30. For covering the first gate insulating layer 30 entirely, the sidewalls of the first gate conductive pattern 62 are preferably placed on the isolation layers 4 in the first region "A." And, the lower electrode 64 of the capacitor is disposed on the isolation layer 4 in the capacitor region "D."

Figure 5B:
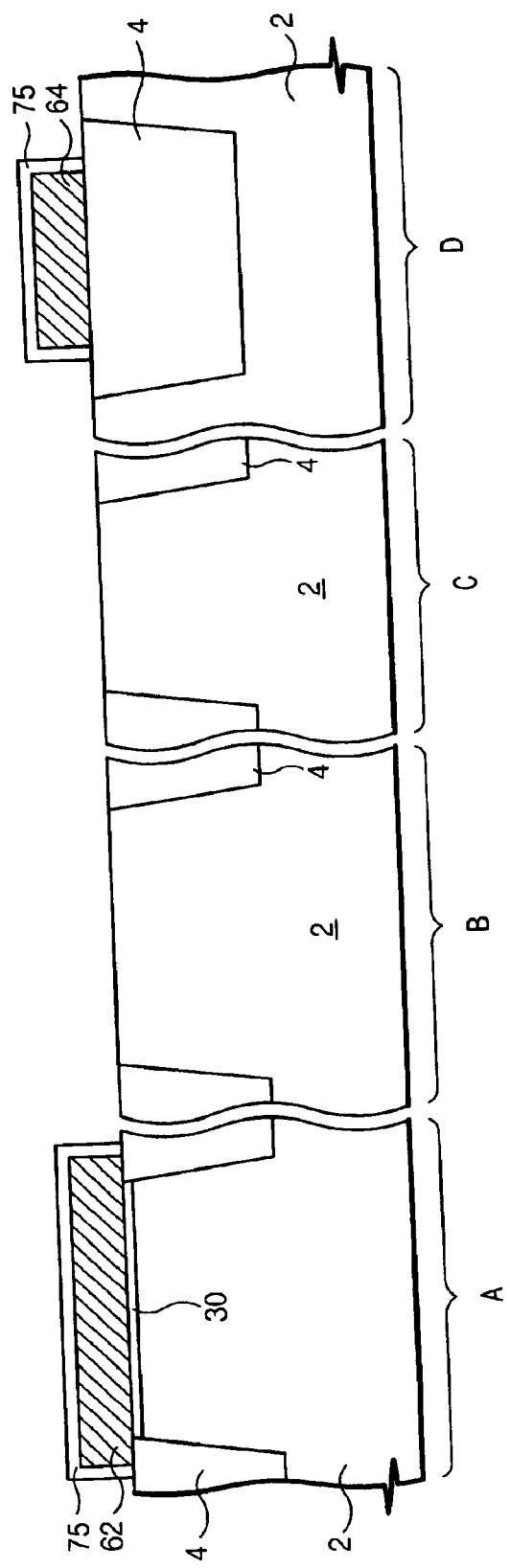

Referring to FIG. 5B, a dielectric layer is formed on the semiconductor substrate 2 having the first gate conductive pattern 62 and the lower electrode 64. The dielectric layer is then patterned to form a dielectric pattern 75 to cover the upper and side surfaces of the first gate conductive pattern 62 and the lower electrode 64. In addition, the dielectric layer is removed from the second region "B" and third region "C."

The dielectric layer is a material selected from the group consisting of silicon oxide, silicon nitride, oxide-nitride-oxide, tantalum oxide, barium-strontium-titanium oxide, zirconium oxide, hafnium oxide, plumbum-zinc-titanium oxide, strontium-bismuth-tantalum oxide, and any combination thereof. According to this embodiment of the present invention, the dielectric layer is preferably formed of an oxide-nitride-oxide layer.

Figure 5C:
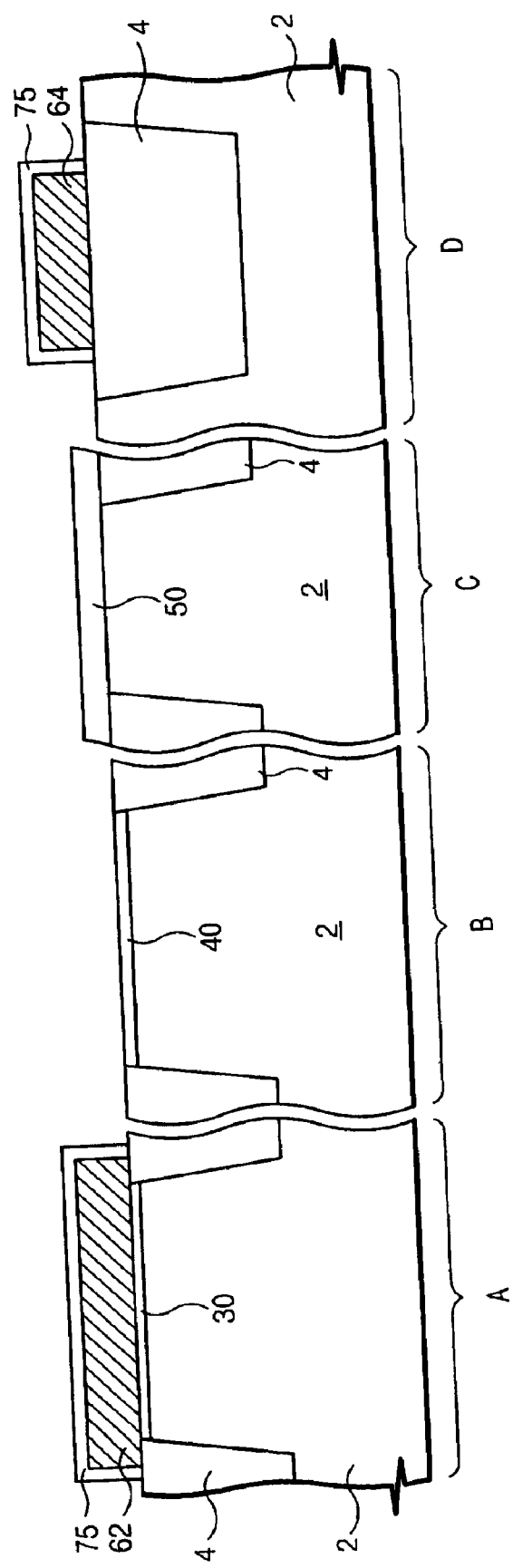

Referring to FIG. 5C, after patterning the dielectric layer, a second gate insulating layer 40 and a third gate insulating layer 50 is formed on the second region "B" and the third region "C," respectively. According to this embodiment of the present invention, the second gate insulating layer 40 may be a silicon dioxide layer, which is grown to a thickness of between about 10 Å to about 100 Å by thermal oxidation. And, the third gate insulating layer 50 is a silicon dioxide layer, which is deposited to a thickness of between about 100 Å to about 1000 Å by a chemical vapor deposition.

Further, the processes of forming the second insulating layer 40 and the third gate insulating layer 50 can comprise forming a first silicon oxide layer and a mask layer stacked sequentially on the second region "B" and third region "C." Then, the mask layer is patterned to form a mask pattern that covers the second region "B" and exposes the third region "C." Next, a second silicon oxide layer, which will be used as the third gate insulating layer 50, is formed on the semiconductor substrate 2 with the mask pattern using a chemical vapor deposition. The second silicon oxide layer, the mask pattern and the first silicon oxide layer are then patterned to expose the semiconductor substrate 2 in the second region "B." Next, another silicon oxide layer, which will be used as the second gate insulating layer 40, is formed on the exposed semiconductor substrate 2 in the second region "B" by thermal oxidation.

In addition, a dielectric layer consisting of an oxide-nitride-oxide layer can replace the first silicon oxide layer, the mask layer and the second silicon oxide layer. Further, other processes can be envisioned based upon the method described above for forming the second and third gate insulating layers 40 and 50.

Figure 5D:
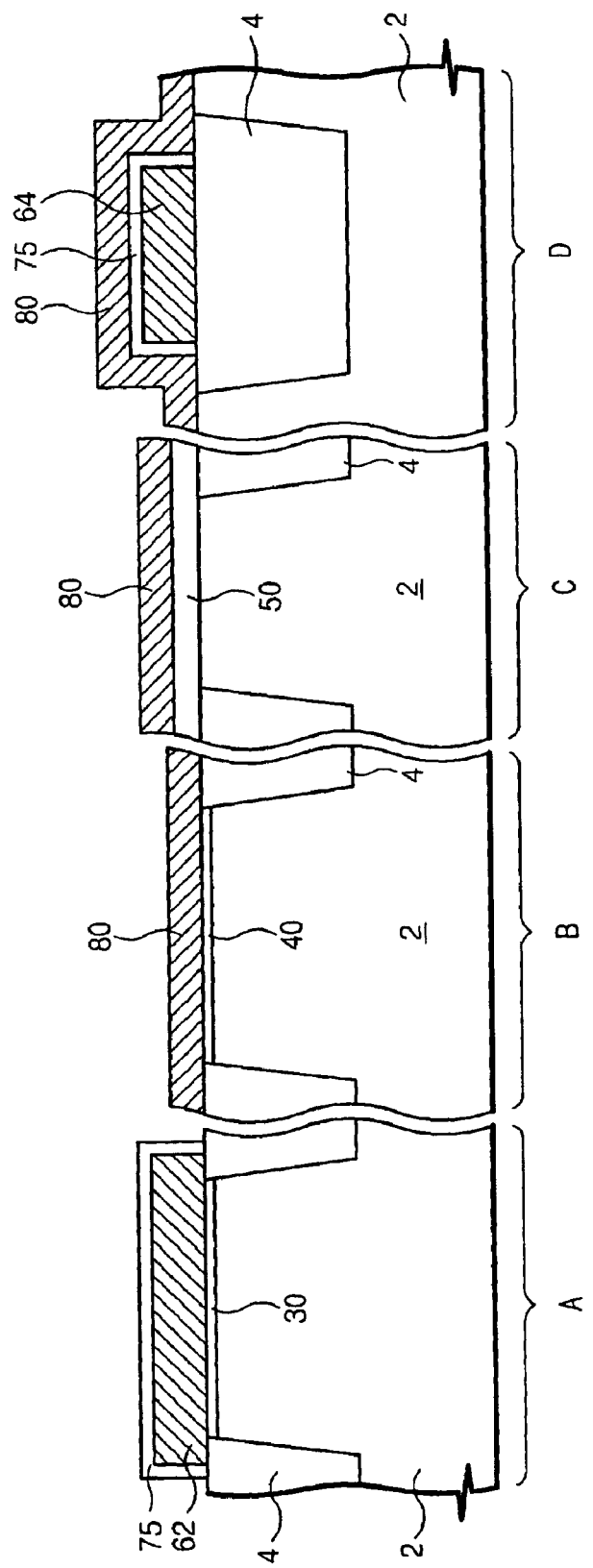

Referring to FIG. 5D, a second gate conductive layer is formed on the semiconductor substrate 2 having the second insulating layer 40 and the third gate insulating layer 50. Next, the second gate conductive layer is patterned to form a second gate conductive pattern 80 exposing the first region "A." According to this embodiment of the present invention, the second gate conductive pattern 80 is removed from the first region "A" to expose the top surface of the dielectric pattern 75 thereof.

The second gate conductive pattern 80 is preferably formed of the same material as the first gate conductive pattern 62. According to this embodiment of the present invention, the first gate conductive pattern 62 and second gate conductive pattern 80 are preferably formed of a polycrystalline silicon layer.

Figure 5E:
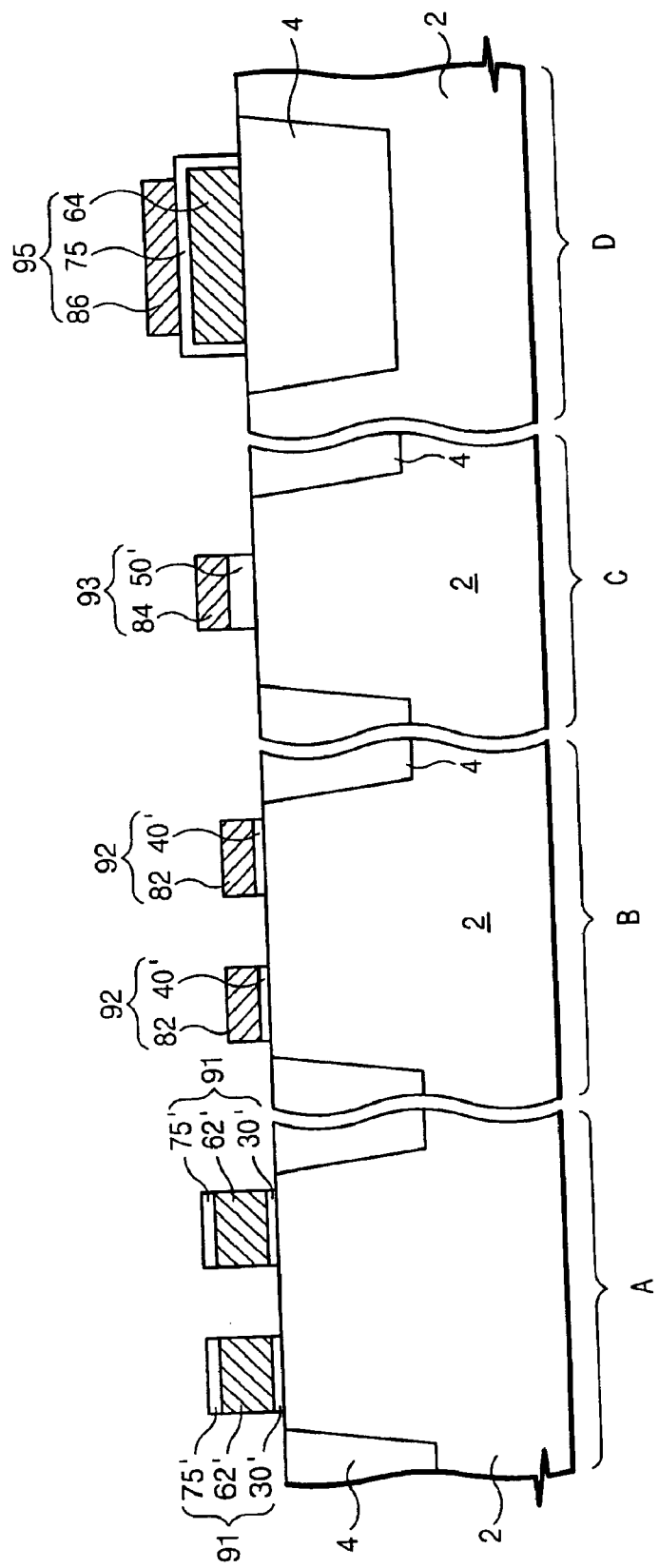

Referring to FIG. 5E, the first gate conductive pattern 62 and the second gate conductive pattern 80 are patterned together to form first gate stacks 91, second gate stacks 92, a third gate stack 93 and a capacitor structure 95. The first gate stacks 91, second gate stacks 92, third gate stack 93 and capacitor structure 95 are formed on the first region "A," second region "B," third region "C," and capacitor region "D," respectively. Preferably, the patterning process is performed so that the semiconductor substrate 2 is exposed in the first region "A," second region "B," and third region "C," and the dielectric pattern 75 is exposed in the capacitor region "D."

Thus, the first gate stacks 91 comprise a first gate insulating pattern 30', a first gate electrode 62' and a first capping pattern 75' sequentially stacked on the first region "A." The second gate stacks 92 comprise a second gate insulating pattern 40' and a second gate electrode 82 sequentially stacked on the second region "B," and the third gate stack 93 comprises a third gate insulating pattern 50' and a third gate electrode 84 sequentially stacked on the third region "C." And, the capacitor structure 95 comprises the capacitor lower electrode 64, the dielectric pattern 75 and the capacitor upper electrode 86 stacked sequentially on the isolation layer 4 in the capacitor region "D." The capping pattern 75' corresponds to the dielectric pattern 75 remaining on the first gate conductive pattern 62 after the above patterning.

Figure 6A:
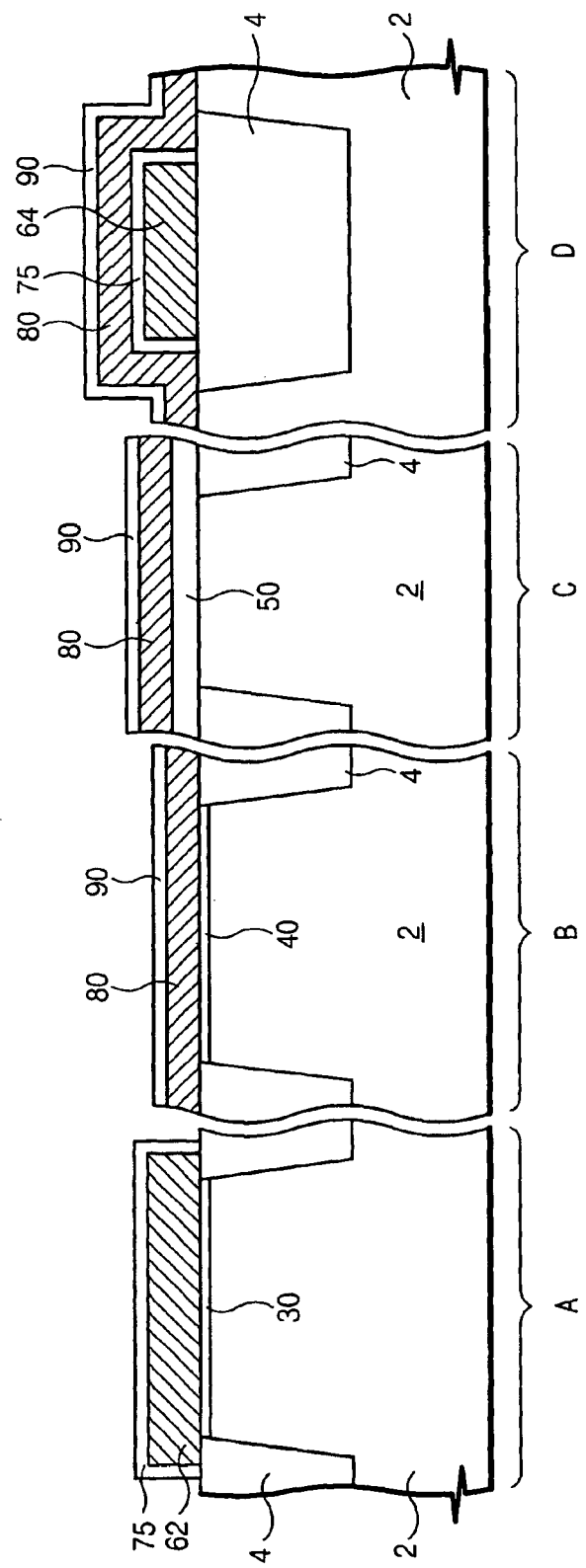
FIGS. 6A, 6B and 7 are cross-sectional views showing steps of forming MOS transistors and a capacitor in accordance with the modifications of the fifth embodiment of the present invention.
Figure 6B:
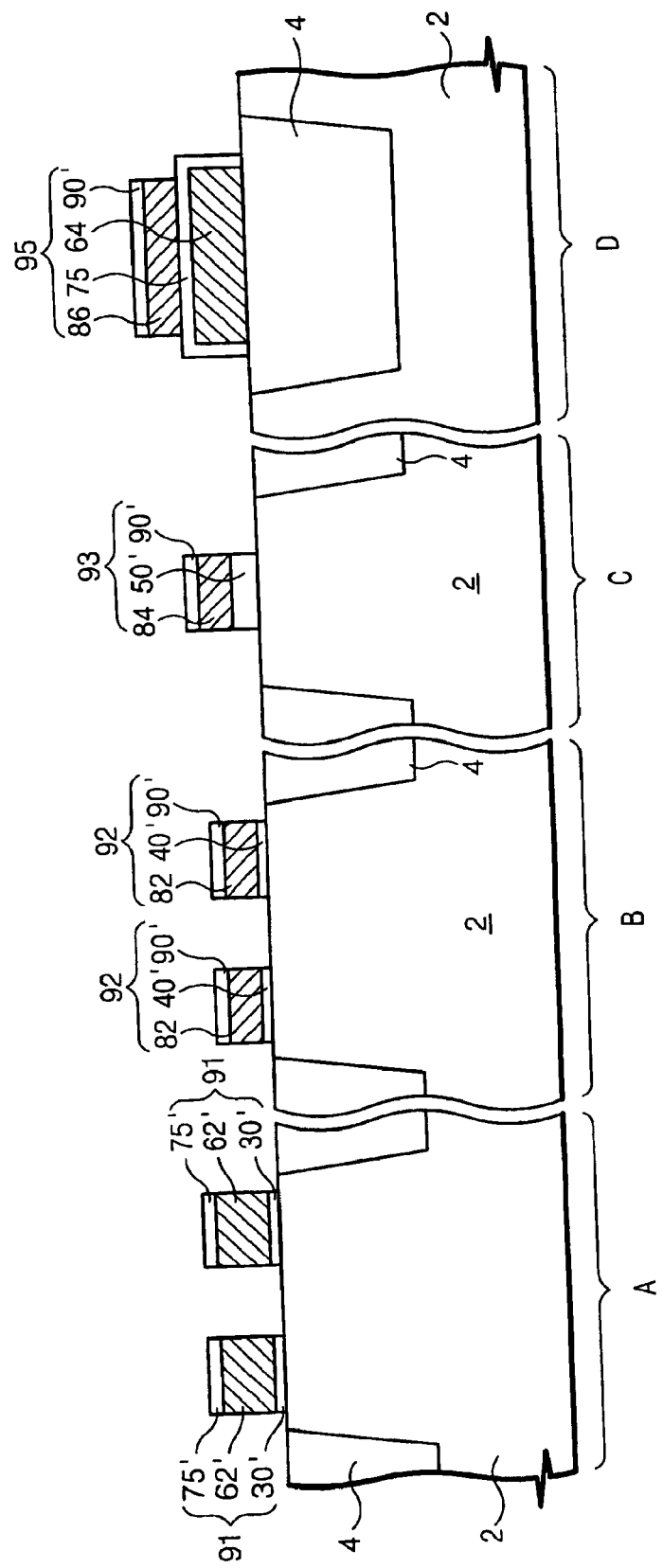
Figure 7:
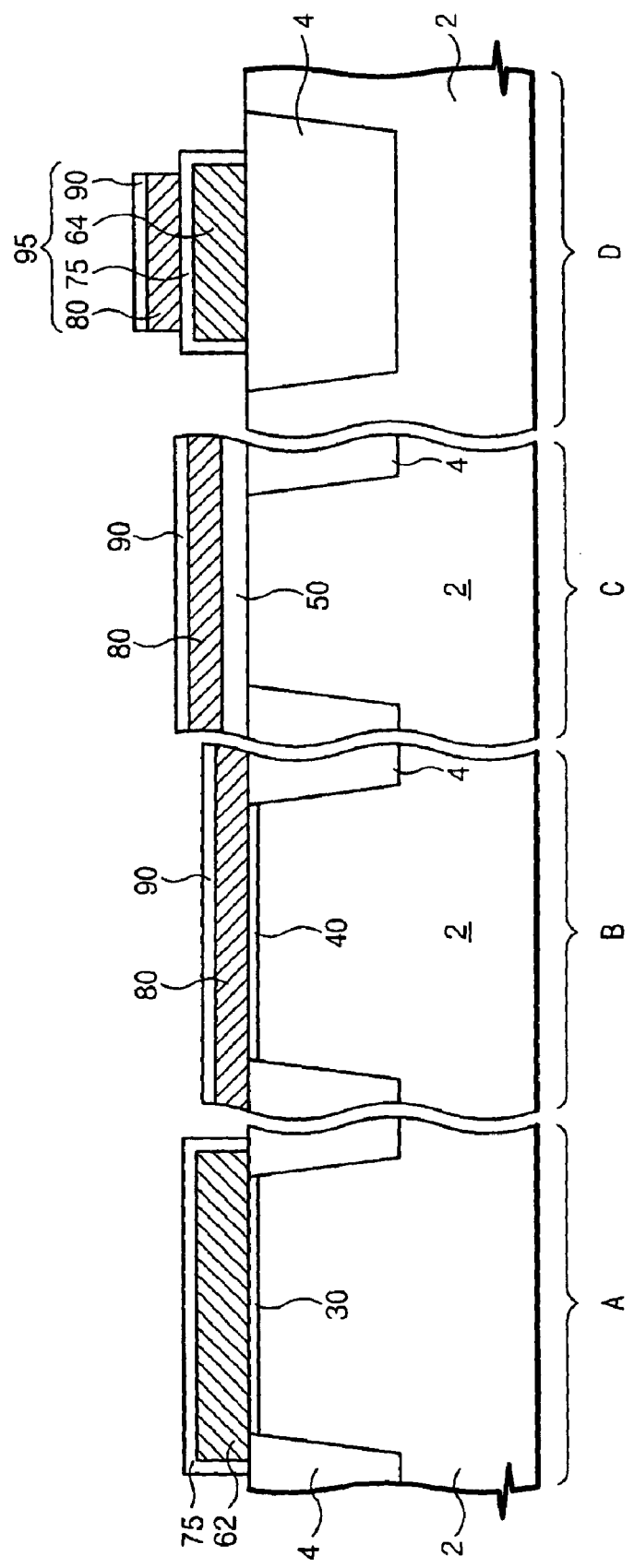

The aforementioned fifth embodiment of the present invention can be modified as shown in FIGS. 6A, 6B and 7. Further, the steps illustrated by FIGS. 5A–5C are the same and will be omitted in the following explanation pertaining to the following modifications of the fifth embodiment.

Referring to FIGS. 5C and 6A, an anti-reflecting layer 90 is formed on the second gate conductive layer before patterning the second gate conductive layer, and then a photo resist pattern (not shown) exposing the first region "A" is formed on the anti-reflecting layer 90. Next, the anti-reflecting layer 90 and the second gate conductive layer are sequentially patterned using the photo resist pattern as an etching mask. Thus, the second gate conductive pattern 80 and the anti-reflecting layer 90 stacked sequentially are formed on the second region "B", third region "C", and capacitor region "D" while exposing the dielectric pattern 75 on the first region "A."

Referring to FIG. 6B, as shown in FIG. 5E, first gate stacks 91, second gate stacks 92, a third gate stack 93 and a capacitor structure 95 are formed on the first region "A," second region "B," third region "C" and capacitor region "D," respectively. According to this modification of the fifth embodiment, the second gate stacks 92, the third gate stack 93 and the capacitor structure 95 comprise an additional anti-reflecting pattern 90'.

Preferably, the anti-reflecting layer is formed of a material that has a non-selective etching characteristic with respect to the dielectric pattern 75 during the patterning process. For example, the anti-reflecting layer may be a material having an etching selectivity of between about 50 to about 150% with respect to the dielectric pattern 75 during the patterning process. To obtain this characteristic of an etching selectivity, the anti-reflecting material is carefully selected and the thickness of the anti-reflecting material is controlled. Preferably, the anti-reflecting layer 90 is a material selected from a group consisting of a silicon oxide layer, a silicon oxynitride, a silicon nitride, and any combination thereof.

According to the fifth embodiment of the present invention, the capacitor upper electrode 86 and the second gate conductive pattern 84 may be formed simultaneously. And, as shown in FIGS. 6A and 6B, the anti-reflecting layer 90 is further formed on the second gate conductive layer before patterning the second gate conductive layer. During the patterning step shown in FIG. 6B, the capacitor region "D" may be covered by a masking layer such as a photo resist pattern.

According to the fifth embodiment and modified embodiments thereof, three different gate stacks 91, 92 and 93 and a capacitor structure 95 are formed by performing a single gate patterning process, wherein the three different gate stacks 91, 92 and 93 have gate insulating layers 30', 40' and 50', respectively. Further, the gate insulating layers 30', 40', and 50' can have different thicknesses.

In general, since the gate patterning process requires precise and strict control of process conditions, the fifth embodiment and its modifications comprising the single gate patterning process further reduce the number of processes for forming a semiconductor device. Thus, the reduced number of processes can lower production cost as compared to the preceding embodiments. According to the fifth embodiment and its modified embodiments, the profile after etching process can be minimized and improved. And, the abovementioned residue problem can be also prevented.

According to the embodiments of the present invention, MOS transistors including gate insulation layers having different thicknesses are formed using typical fabrication steps and structures of a capacitor, a resistance, an electrically erasable and programmable read only memory or the like.

While the present invention has been described in connection with specific and exemplary embodiments thereof, it is capable of various changes and modifications without departing from the spirit and scope of the invention.

What is claimed is:

1. A method of forming a semiconductor device comprising:
    (a) forming isolation layers in predetermined regions of a semiconductor substrate to define a first region, a second region and a third region;
    (b) forming a first gate insulating layer and a first gate conductive pattern stacked sequentially on the first region, a second gate insulating layer and a second gate conductive pattern stacked sequentially on the second region, and a third gate insulating layer and the second gate conductive pattern stacked sequentially on the third region; and (c) patterning together the first gate conductive pattern and the second gate conductive pattern to form a first gate electrode, a second gate electrode and a third gate electrode in the first, second and third regions, respectively, wherein the first gate insulating layer, the second gate insulating layer and the third insulating layer are formed having varying thicknesses and each layer has a different thickness than the other layers.

2. The method of claim 1, wherein the (b) step comprises:

forming the first gate insulating layer and the first gate conductive pattern stacked sequentially on the first region;

forming a second gate conductive layer on the entire surface of the semiconductor substrate having the second and third gate insulating layers; and patterning the second gate conductive layer to form the second gate conductive pattern exposing the first gate conductive pattern in the first region.

3. The method of claim 2, wherein forming the first gate insulating layer and the first gate conductive pattern comprises:

forming the first gate insulating layer on the first region;

forming a first gate conductive layer on the semiconductor substrate having the first gate insulating layer; and patterning the first gate conductive layer to form the first gate conductive pattern and a capacitor lower electrode, the first gate conductive pattern is disposed in the first region and the capacitor lower electrode is disposed on a predetermined region of the isolation layers.

4. The method of claim 3, after patterning the first gate conductive layer, further comprising:

forming a dielectric layer on the semiconductor substrate having the first gate conductive pattern and the capacitor lower electrode;

patterning the dielectric layer to form a dielectric pattern, the dielectric pattern exposes the second and third regions and covers the first conductive pattern and the capacitor lower electrode.

5. The method of claim 4, wherein the dielectric layer is a material selected from the group consisting of silicon oxide, silicon nitride, oxide-nitride-oxide, tantalum oxide, barium-strontium-titanium oxide, zirconium oxide, halhium oxide, plumbum-zinc-titanium oxide, strontium-bismuth-tantalum oxide, and any combination thereof.

6. The method of claim 4, further comprising forming an anti-reflecting layer on the second gate conductive layer, before patterning the second gate conductive layer, wherein forming the anti-reflecting layer comprises selecting a material and controlling a thickness of the selected material for the anti-reflecting layer to provide, in the step (c), the anti-reflecting layer having a non-selective etching characteristic with respect to the dielectric layer.

7. The method of claim 4, wherein forming the second gate conductive pattern comprises forming a capacitor upper electrode on the dielectric pattern opposite the capacitor lower electrode.

8. The method of claim 4, wherein the step (c) further comprises forming a capacitor upper electrode on the dielectric pattern opposite the capacitor lower electrode.

9. The method of claim 1, wherein the first gate conductive pattern and the second conductive pattern are formed of the same material.

10. The method of claim 9, wherein the first gate conductive pattern and the second conductive pattern are formed of polycrystalline silicon.

11. The method of claim 1, wherein the first gate insulating layer is silicon dioxide with a thickness of between about 50 Å to about 300 Å formed by thermal oxidation;

the second gate insulating layer is silicon dioxide with a thickness of between about 10 Å to about 100 Å formed by thermal oxidation; and the third gate insulating layer is silicon dioxide with a thickness of between about 100 Å to about 1000 Å formed by a chemical vapor deposition.

* * * * *